(12) United States Patent
Kim et al.

(10) Patent No.: US 12,598,842 B2
(45) Date of Patent: Apr. 7, 2026

(54) LIGHT EMITTING DISPLAY PANEL

(71) Applicant: LG Display Co., Ltd., Seoul (KR)

(72) Inventors: Yongjae Kim, Paju-si (KR); Seogshin Kang, Paju-si (KR); Saehoon Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 689 days.

(21) Appl. No.: 17/965,153

(22) Filed: Oct. 13, 2022

(65) Prior Publication Data

US 2023/0231084 A1 Jul. 20, 2023

(30) Foreign Application Priority Data

Dec. 30, 2021 (KR) ........................ 10-2021-0192164

(51) Int. Cl.
*H10H 20/851* (2025.01)
*H10H 20/831* (2025.01)
*H10H 29/14* (2025.01)

(52) U.S. Cl.
CPC .... *H10H 20/8512* (2025.01); *H10H 20/8312* (2025.01); *H10H 29/142* (2025.01)

(58) Field of Classification Search
None
See application file for complete search history.

(56) References Cited

U.S. PATENT DOCUMENTS 9,753,327 B2 9/2017 Park et al.
10,373,978 B2 8/2019 Lee et al.

2005/0062407 A1* 3/2005 Suh ........................ H10K 59/38
                                                    313/506
2008/0081105 A1* 4/2008 Suh ........................ H05B 33/14
                                                    427/58
2010/0219429 A1* 9/2010 Cok ..................... H10K 50/865
                                                    257/89
2016/0377920 A1 12/2016 Park et al.
2018/0182815 A1* 6/2018 Choi .................... H10K 59/124
2018/0211979 A1* 7/2018 Lee ...................... H10K 59/124
2020/0105855 A1* 4/2020 Lee ........................ H10K 59/12
2022/0293704 A1* 9/2022 Cao ..................... H10K 59/123

FOREIGN PATENT DOCUMENTS

KR 10-2017-0000444 A 1/2017
KR 10-2018-0074644 A 7/2018
KR 10-2018-0087908 A 8/2018

OTHER PUBLICATIONS

Korean Intellectual Property Office, Office Action, Korean Patent Application No. 10-2021-0192164, Mar. 6, 2025, 13 pages.

* cited by examiner

*Primary Examiner* — Bilkis Jahan
(74) *Attorney, Agent, or Firm* — Fenwick & West LLP

(57) ABSTRACT

A light emitting display panel includes: a pixel driving circuit layer on a substrate; a planarization layer on the pixel driving circuit layer, a plurality of anode electrodes on the planarization layer, the plurality of anode electrodes including a white anode electrode and a blue anode electrode; a white quantum layer under the white anode electrode, the white quantum layer including first quantum dots; and a blue quantum layer under the blue anode electrode, the blue quantum layer including second quantum dots.

21 Claims, 8 Drawing Sheets

LIGHT EMITTING DISPLAY PANEL

CROSS-REFERENCE TO RELATED APPLICATION

This application claims the benefit of Republic of Korea Patent Application No. 10-2021-0192164 filed on Dec. 30, 2021, which is hereby incorporated by reference in its entirety.

BACKGROUND

Field of Technology

The present disclosure relates to a light emitting display panel.

Discussion of the Related Art

Light emitting display panels self-emit light to display an image.

In order to increase the amount of light output to the outside, an anode electrode may be formed of metal having a high reflectance. However, when the anode electrode is formed of metal having a high reflectance, light flowing from outside of a light emitting display panel into the light emitting display panel may be reflected by the anode electrode, and thus, a reflectance of the light emitting display panel may increase.

In order to decrease reflection of external light, a material for absorbing light may be wholly provided in a light emitting display panel. In this case, a reflectance of external light may be reduced, but the amount of light which is emitted by a light emitting display panel and is output to the outside may decrease. Due to this, the emission efficiency of a light emitting display panel may decrease.

SUMMARY

Accordingly, the present disclosure is directed to providing a light emitting display panel that substantially obviates one or more problems due to limitations and disadvantages of the related art.

One embodiment of the present disclosure is directed to providing a light emitting display panel in which a planarization layer includes a black material and a quantum layer including blue quantum dots is provided under an anode electrode of each of a white pixel and a blue pixel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In one embodiment a light emitting display panel comprises: a pixel driving circuit layer on a substrate; a planarization layer on the pixel driving circuit layer; a plurality of anode electrodes on the planarization layer, the plurality of anode electrodes including a white anode electrode and a blue anode electrode; a white quantum layer under the white anode electrode such that the white quantum layer is closer to the substrate than the white anode electrode, the white quantum layer including first quantum dots; and a blue quantum layer under the blue anode electrode such that the blue quantum layer is closer to the substrate than the blue anode electrode, the blue quantum layer including second quantum dots.

In one embodiment, a light emitting display panel comprises: a pixel driving circuit layer on a substrate; a planarization layer on the pixel driving circuit layer; a plurality of anode electrodes on the planarization layer, the plurality of anode electrodes including a blue anode electrode; and a blue quantum layer provided under the blue anode electrode such that the blue quantum layer is closer to the substrate than the blue anode electrode, the blue quantum layer including quantum dots.

In one embodiment, a light emitting display panel comprises: a pixel driving circuit layer on a substrate; a planarization layer on the pixel driving circuit layer, the planarization layer including black material that absorbs light; a plurality of anode electrodes on the planarization layer; and a quantum layer under an anode electrode from the plurality of anode electrodes such that the quantum layer is closer to the substrate than the anode electrode, the quantum layer including quantum dots.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIGS. 6 to 8 are other exemplary diagrams illustrating in detail a cross-sectional surface taken along line A-A' illustrated in FIGS. 3A and 3B according to one embodiment of the present disclosure; and FIG. 9 is another exemplary diagram illustrating a cross-sectional surface of a light emitting display panel according to one embodiment of the present disclosure.

DETAILED DESCRIPTION

Figure 1:
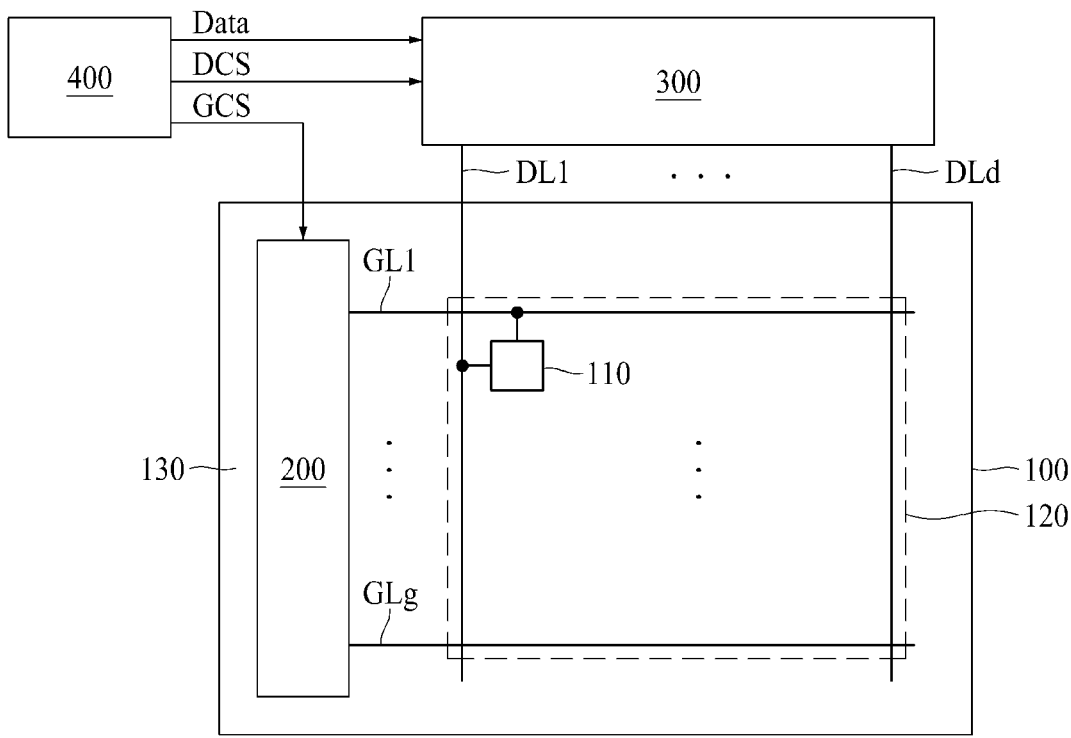
FIG. 1 is an exemplary diagram illustrating a configuration of a light emitting display apparatus including a light emitting display panel according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
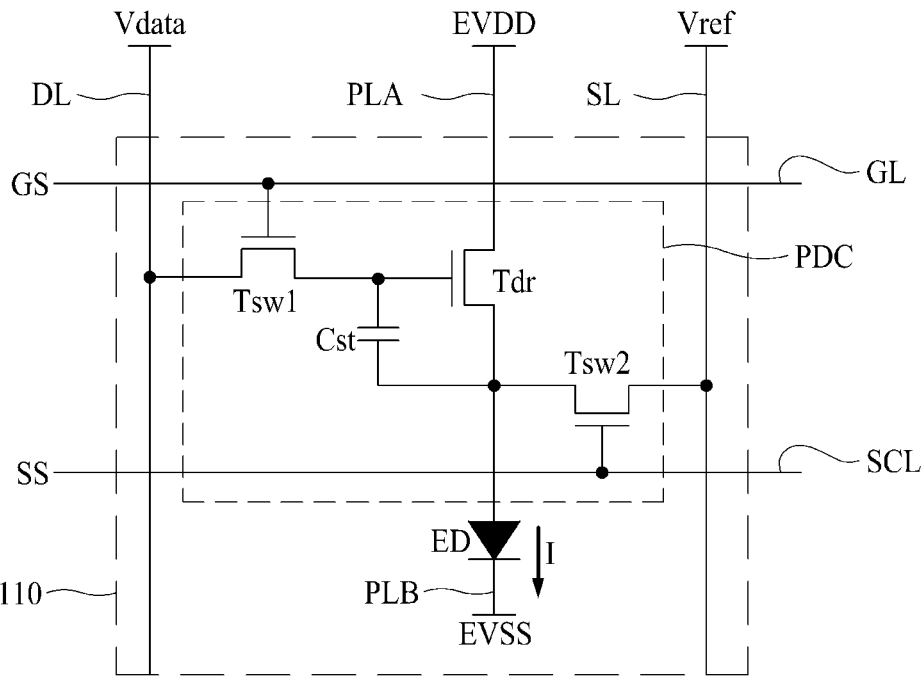
FIG. 2 is an exemplary diagram illustrating a structure of a pixel included in the light emitting display panel according to one embodiment of the present disclosure;
m

FIG. 1 is an exemplary diagram illustrating a configuration of a light emitting display apparatus including a light emitting display panel according to one embodiment of the present disclosure, and FIG. 2 is an exemplary diagram illustrating a structure of a pixel included in the light emitting display panel according to one embodiment of the present disclosure.

The light emitting display apparatus to which the light emitting display panel according to the present disclosure is applied may configure various electronic devices. The electronic devices may include, for example, smartphones, tablet personal computers (PCs), televisions (TVs), and monitors.

The light emitting display apparatus to which the present disclosure is applied, as illustrated in FIG. 1, may include a light emitting display panel 100 which includes a display area 120 displaying an image and a non-display area 130 provided outside the display area 120 that does not display the image, a gate driver 200 which supplies a gate signal to a plurality of gate lines GL1 to GLg provided in the display area 120 of the light emitting display panel 100, a data driver 300 which supplies data voltages to a plurality of data lines DL1 to DLd provided in the light emitting display panel 100, a controller 400 which controls driving of the gate driver 200 and the data driver 300, and a power supply which supplies power to the controller 400, the gate driver 200, the data driver 300, and the light emitting display panel 100.

First, the light emitting display panel 100 may include the display area 120 and the non-display area 130. The gate lines GL1 to GLg, the data lines DL1 to DLd, and the pixels 110 may be provided in the display area 120. Accordingly, the display area 120 may display an image. Here, g and d may each be a natural number. The non-display area 130 may surround an outer portion of the display area 120.

The pixel 110 included in the light emitting display panel 100, as illustrated in FIG. 2, may include an emission area which includes a pixel driving circuit PDC and a light emitting device ED. The pixel driving circuit PDC may include a switching transistor Tsw1, a storage capacitor Cst, a driving transistor Tdr, and a sensing transistor Tsw2 in one example.

A first terminal of the driving transistor Tdr may be connected to a high voltage supply line PLA through which a high voltage EVDD is supplied, and a second terminal of the driving transistor Tdr may be connected to the light emitting device ED.

A first terminal of the switching transistor Tsw1 may be connected to the data line DL, a second terminal of the switching transistor Tsw1 may be connected to a gate of the driving transistor Tdr, and a gate of the switching transistor Tsw1 may be connected to a gate line GL.

A data voltage Vdata may be supplied to a data line DL, and a gate signal GS may be supplied to the gate line GL.

The sensing transistor Tsw2 may be provided for measuring a threshold voltage or mobility of the driving transistor. A first terminal of the sensing transistor Tsw2 may be connected to a second terminal of the driving transistor Tdr and the light emitting device ED, a second terminal of the sensing transistor Tsw2 may be connected to a reference voltage line RL through which a reference voltage Vref is supplied, and a gate of the sensing transistor Tsw2 may be connected to a sensing control line SCL through which a sensing control signal SS is supplied.

A structure of the pixel 110 included in the light emitting display panel 100 is not limited to a structure illustrated in FIG. 2. Accordingly, the structure of the pixel 110 may be changed to various types.

The data driver 300 may be mounted on a chip on film (COF) attached on the light emitting display panel 100, or may be directly equipped in the light emitting display panel 100.

The data driver 300 may supply data voltages Vdata to the data lines DL1 to DLd.

The controller 400 may realign input video data transferred from an external system by using a timing synchronization signal transferred from the external system and may generate control signals DCS and GCS which are to be supplied to the data driver 300 and the gate driver 200.

To this end, the controller 400 may include a data aligner which realigns input video data to generate image data Data and supplies the image data Data to the data driver 300, a control signal generator which generates a gate control signal GCS and a data control signal DCS by using the timing synchronization signal, an input unit which receives the timing synchronization signal and the input video data transferred from the external system and respectively transfers the timing synchronization signal and the input video data to the data aligner and the control signal generator, and an output unit which supplies the data driver 300 with the image data Data generated by the data aligner and the data control signal DCS generated by the control signal generator and supplies the gate driver 200 with the gate control signals GCS generated by the control signal generator.

The external system may perform a function of driving the controller 400 and an electronic device. For example, when the electronic device is a TV, the external system may receive various sound information, video information, and letter information over a communication network and may transfer the received video information to the controller 400. In this case, the image information may include input video data.

The power supply may generate various powers and may supply the generated powers to the controller 400, the gate driver 200, the data driver 300, and the light emitting display panel 100.

Finally, the gate driver 200 may be configured as an integrated circuit (IC) and mounted in the non-display area 130. Also, the gate driver 200 may be directly embedded in the non-display area 130 by using a gate in panel (GIP) type. In a case which uses the GIP type, transistors configuring the gate driver 200 may be provided in the non-display area through the same process as transistors included in each of the pixels 110.

The gate driver 200 may supply gate pulses to the gate lines GL1 to GLg.

Figure 3A:
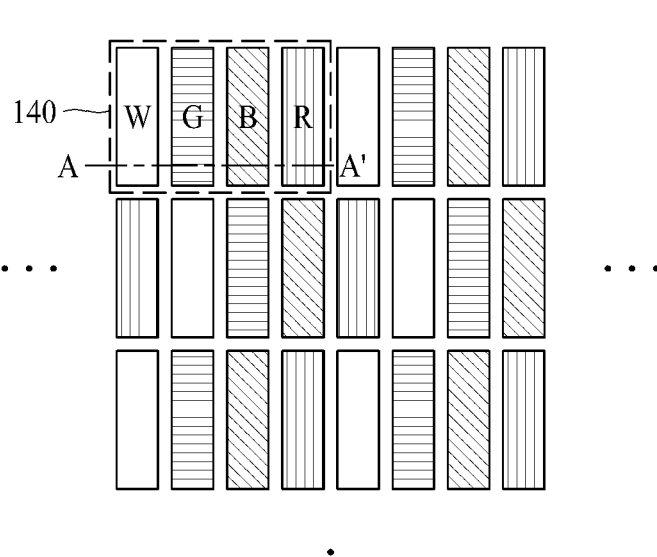
FIGS. 3A and 3B are exemplary diagrams illustrating an arrangement structure of pixels configuring the light emitting display panel according to one embodiment of the present disclosure.
Figure 3B:
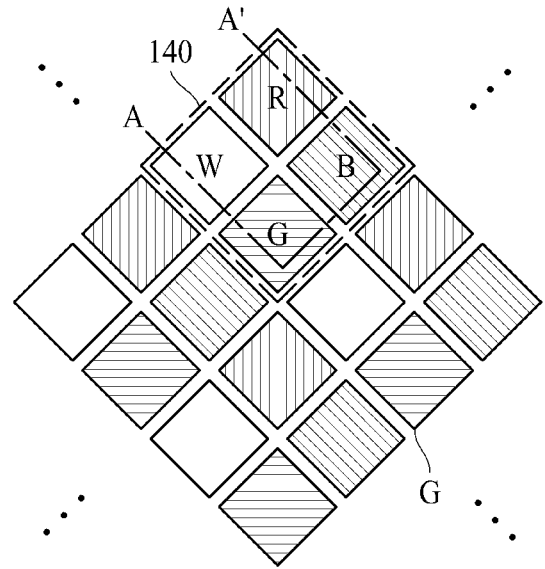
Figure 4:
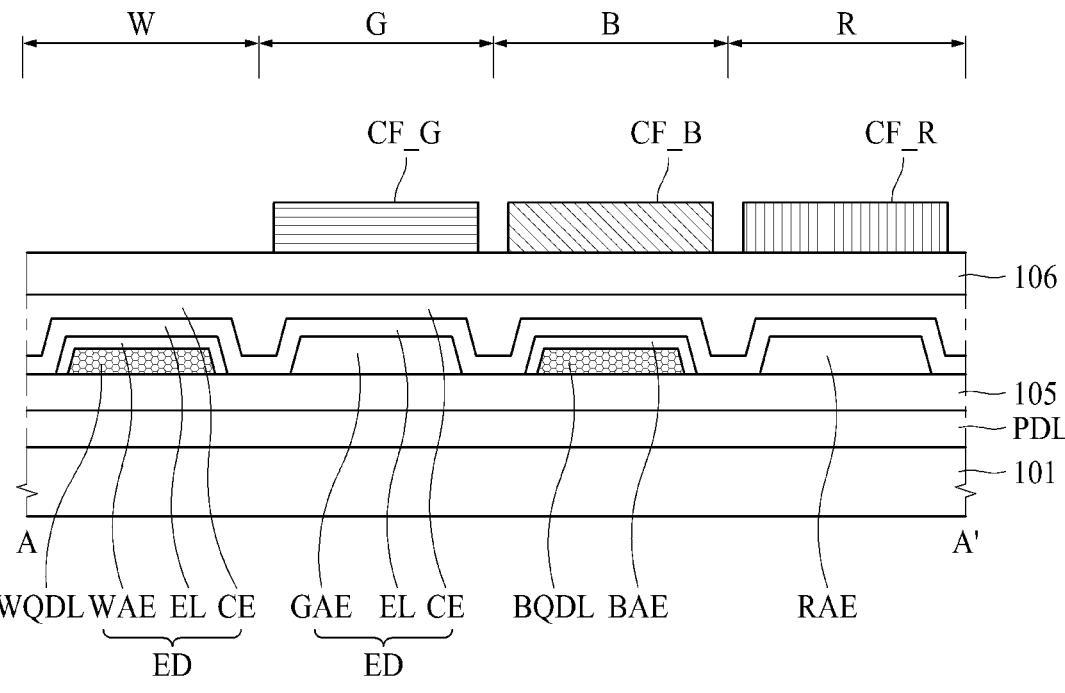
FIG. 4 is an exemplary diagram illustrating a cross-sectional surface taken along line A-A' illustrated in FIGS. 3A and 3B according to one embodiment of the present disclosure.

FIGS. 3A and 3B are exemplary diagrams illustrating an arrangement structure of pixels included in the light emitting display panel according to one embodiment of the present disclosure, and FIG. 4 is an exemplary diagram illustrating a cross-sectional surface taken along line A-A' illustrated in FIGS. 3A and 3B according to one embodiment of the present disclosure. Hereinafter, a basic structure of the light emitting display panel according to the present disclosure will be described with reference to FIGS. 3A to 4.

The light emitting display panel according to the present disclosure, as illustrated in FIGS. 3A, 3B, and 4, may include a pixel driving circuit layer PDL, a planarization layer 105 on the pixel driving circuit layer PDL such that the planarization layer covers the pixel driving circuit layer PDL for example, anode electrodes AE which are provided on the planarization layer 105, a white quantum layer WQDL which is provided under a white anode electrode WAE of the anode electrodes and includes quantum dots, and a blue quantum layer BQDL which is provided under a blue anode electrode BAE of the anode electrodes and includes quantum dots. That is, the white quantum layer WQDL is closer to the substrate 101 than the white anode electrode WAE and the blue quantum layer BQDL is closer to the substrate 101 than the blue anode electrode BAE.

First, the white quantum layer WQDL including the quantum dots may be provided under the white anode electrode WAE, and the blue quantum layer BQDL including the quantum dots may be provided under the blue anode electrode BAE.

Quantum dots may perform a function of scattering light flowing into the quantum layer.

That is, light flowing into the white quantum layer WQDL may be scattered by the white quantum layer WQDL and may be output to the outside of the light emitting display panel through the white anode electrode WAE. Accordingly, the luminance of a white pixel W may increase.

Moreover, light flowing into the blue quantum layer BQDL may be scattered by the blue quantum layer BQDL and may be output to the outside of the light emitting display panel through the blue anode electrode BAE. Accordingly, the luminance of a blue pixel B may increase.

To provide an additional description, the luminance of the white pixel W may be increased by the white quantum layer WQDL, and the luminance of the blue pixel B may be increased by the blue quantum layer BQDL.

Second, the planarization layer 105 may include a black material. Accordingly, the planarization layer 105 may perform a function of absorbing light.

That is, external light flowing from outside the light emitting display panel 100 to an inner portion of the light emitting display panel 100 may be absorbed by the planarization layer 105, and thus, a reflectance of the light emitting display panel 100 according to the present disclosure may decrease.

In the present disclosure, as described above, a reflectance of external light may be reduced by the planarization layer 105 configuring the light emitting display panel. Therefore, a polarization film which performs a function of decreasing a reflectance of external light may not additionally be included in the light emitting display panel 100. Accordingly, according to the present disclosure, the manufacturing cost of the light emitting display panel 100 may decrease, and the manufacturing cost of the light emitting display panel 100 may be simplified.

Third, as described above, the white quantum layer WQDL and the blue quantum layer BQDL may each include quantum dots.

Particularly, each of the white quantum layer WQDL and the blue quantum layer BQDL may include blue quantum dots which scatter blue light.

The blue quantum dots may scatter blue light of light flowing in from the outside of the light emitting display panel 100, but does not scatter light of other colors such as red light and green light.

In this case, the white quantum layer WQDL included in the white pixel W may scatter blue light of light flowing in from the outside of the light emitting display panel 100, but does not scatter light of other colors such as red light and green light. Furthermore, the scattered blue light may be output to the outside of the light emitting display panel 100 through the white anode electrode WAE.

Therefore, the luminance of light emitted from the white pixel W may increase, and the white pixel W may emit bluish white light. A color temperature of the white pixel W may be enhanced by the bluish white pixel. That is, because white light emitted from the white pixel W has a bluish color, the color temperature of the white pixel W may be enhanced.

To provide an additional description, the bluish white light may be seen in clear white with eyes of a user, and thus, according to the present disclosure, the quality of a light emitting display apparatus may be enhanced.

Moreover, because the blue quantum layer BQDL included in the blue pixel B includes blue quantum dots, the blue quantum layer BQDL may scatter the blue light of light flowing in from the outside, and the scattered blue light may be output to the outside of the light emitting display panel through the blue anode electrode BAE.

Therefore, the luminance of light emitted from the blue pixel B may increase, and when there is the blue quantum layer BQDL, blue light which is clearer than blue light emitted from the blue pixel B may be output to the outside.

Accordingly, according to the present disclosure, the quality of a light emitting display apparatus may be enhanced.

Fourth, a red pixel R including a red anode electrode RAE or a green pixel G including a green anode electrode GAE may be provided between the white pixel W including the white anode electrode WAE and the blue pixel B including the blue anode electrode BAE.

For example, when the white pixel W, the green pixel G, the blue pixel B, and the red pixel R configure a unit pixel 140, as illustrated in FIGS. 3A, 3B, and 4, the white pixel W may be disposed adjacent to the green pixel G and the red pixel R, and the blue pixel B may be disposed adjacent to the green pixel G and the red pixel R.

As described above, the white pixel W and the blue pixel B may be disposed not to be adjacent to each other. Therefore, as illustrated in FIG. 3A, the present disclosure is not limited to that pixels are arranged in the order of the white pixel W, the green pixel G, the blue pixel B, and the red pixel R. When the white pixel W and the blue pixel B are arranged not to be adjacent to each other, the arrangement of pixels may be changed. For example, pixels may be arranged in the order of the red pixel R, the white pixel W, the green pixel G, and the blue pixel B. Alternatively, pixels may be arranged in the order of the blue pixel B, the green pixel G, the white pixel W, and the red pixel R.

Moreover, when a white pixel W, a green pixel G, a blue pixel B, and a red pixel R configuring the unit pixel 140 are arranged in a rhombus shape as illustrated in FIG. 3B, the white pixel W may be arranged to be surrounded by the green pixel G and the red pixel R, and moreover, the blue pixel B may be arranged to be surrounded by the green pixel G and the red pixel R. Referring to FIG. 3B, the white pixel W and the blue pixel B may be arranged so that corners of pixels face each other. Therefore, as in FIG. 3B, the white pixel W and the blue pixel B may be arranged so that corners of pixels face each other in a horizontal direction, but embodiments of the present disclosure are not limited thereto. For example, the white pixel W and the blue pixel B may be arranged so that corners of pixels face each other in a vertical direction.

That is, in the present disclosure, the white pixel W and the blue pixel B may be apart from each other without being adjacent to each other.

In the present disclosure, because each of the white pixel W and the blue pixel B is adjacent to the green pixel G and the red pixel R, blue light scattered in the white quantum layer WQDL may not be output to the outside through the green pixel G and the red pixel R.

That is, blue light which is scattered in the white quantum layer WQDL and flows into the green pixel G or the red pixel R may be blocked by a green color filter CF_G included in the green pixel G or a red color filter CF_R included in the red pixel R. Accordingly, the blue light scattered in the white quantum layer WQDL may not be output to the outside through the green pixel G and the red pixel R.

Moreover, blue light which is scattered in the blue quantum layer BQDL and flows into the green pixel G or the red pixel R may be blocked by the green color filter CF_G included in the green pixel G or the red color filter CF_R included in the red pixel R. Accordingly, the blue light scattered in the blue quantum layer BQDL may not be output to the outside through the green pixel G and the red pixel R.

Accordingly, according to the present disclosure, light leakage may not occur between pixels, and thus, interference between pixels may be prevented or at least reduced.

Fifth, as illustrated in FIG. 4, each of the white quantum layer WQDL and the blue quantum layer BQDL may be provided on the planarization layer 105.

For example, the white quantum layer WQDL and the blue quantum layer BQDL may be stacked on the planarization layer 105 by using an inkjet process. Accordingly, complicated processes for forming the white quantum layer WQDL and the blue quantum layer BQDL may not be needed.

Sixth, as described above, a color temperature of white light emitted from the white pixel W may be enhanced by the white quantum layer WQDL including a blue quantum dot, and a color temperature of the white light emitted from the white pixel W may be controlled by controlling the amount or density of blue quantum dots or a height, an area, or a volume of the white quantum layer WQDL.

According to the present disclosure, a color temperature of the white light emitted from the white pixel W may be enhanced or controlled by the white quantum layer WQDL including a blue quantum dot, and thus, it is not required to correct image, for controlling a color temperature of white light.

Therefore, according to the present disclosure, a function of correcting image data for controlling a color temperature of white light may not be included in the controller 400, and thus, a structure and a function of the controller 400 may be simplified.

Figure 5:
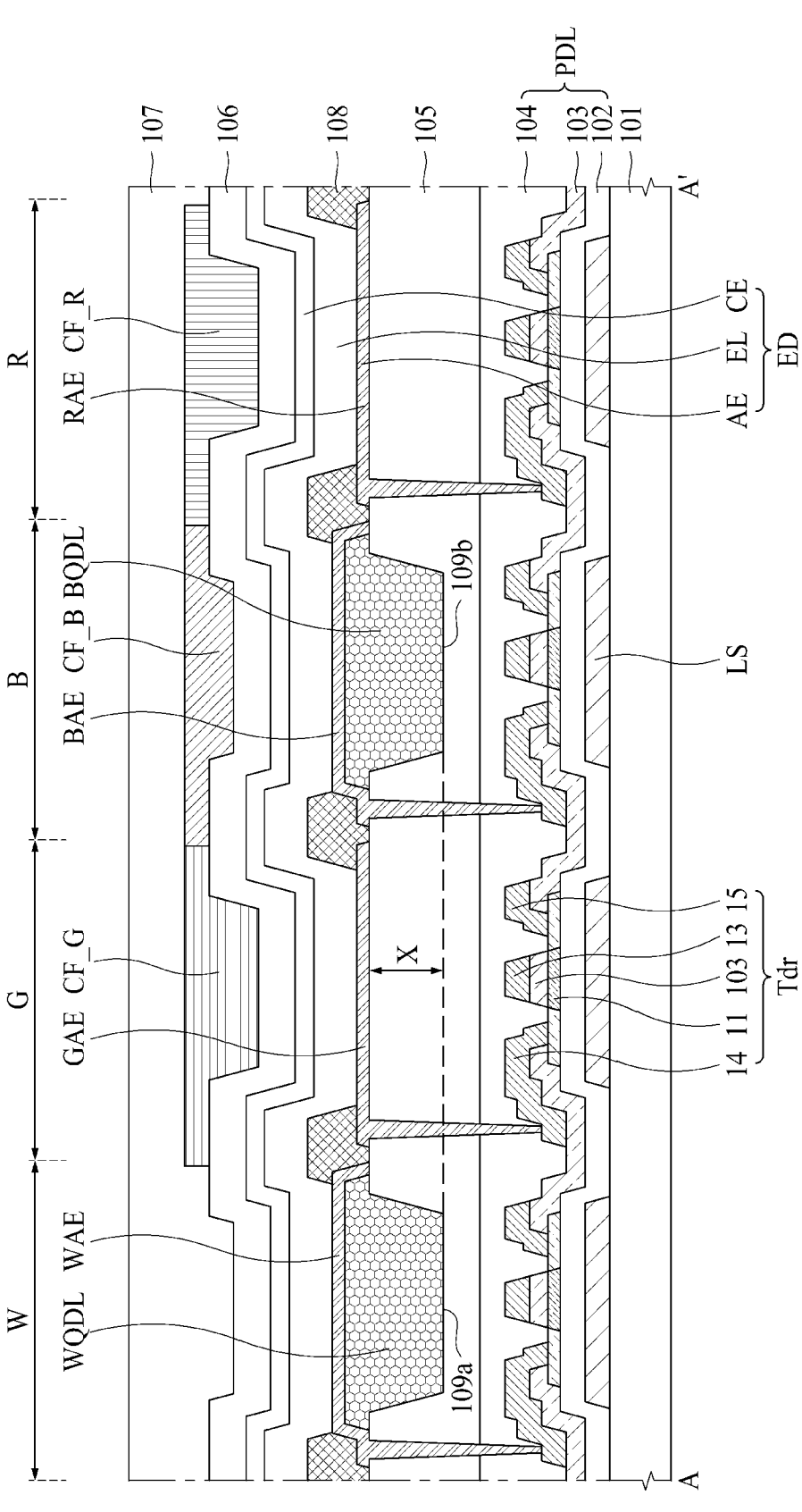
FIG. 5 is an exemplary diagram illustrating in detail a cross-sectional surface taken along line A-A' illustrated in FIGS. 3A and 3B according to one embodiment of the present disclosure.

FIG. 5 is an exemplary diagram illustrating in detail a cross-sectional surface taken along line A-A' illustrated in FIGS. 3A and 3B according to one embodiment. Hereinafter, a detailed structure of a light emitting display panel according to the present disclosure will be described. In the following description, descriptions which are the same as or similar to descriptions given above with reference to FIGS. 1 to 4 are omitted or will be briefly given.

The light emitting display panel according to the present disclosure, as described above, may include a pixel driving circuit layer PDL which is provided on a substrate 101, a planarization layer 105 which covers the pixel driving circuit layer PDL, anode electrodes AE which are provided on the planarization layer 105, a white quantum layer WQDL which is provided under a white anode electrode WAE of the anode electrodes AE and includes quantum dots, and a blue quantum layer BQDL which is provided under a blue anode electrode BAE of the anode electrodes AE and includes quantum dots.

First, the substrate 101 may be a glass substrate or a plastic substrate, and moreover, may include various kinds of films.

The pixel driving circuit layer PDL including a driving transistor Tdr, as illustrated in FIG. 5, may be provided on the substrate 101.

A pixel driving circuit PDC including the driving transistor Tdr may be provided in the pixel driving circuit layer PDL. The pixel driving circuit PDC, as described above with reference to FIG. 2, may include a switching transistor Tsw1, a storage capacitor Cst, a driving transistor Tdr, and a sensing transistor Tsw2.

Moreover, a data line DL, a gate line GL, a sensing control line SCL, a sensing line SL, and a voltage supply line PLA connected to the pixel driving circuit PDC may be provided in the pixel driving circuit layer PDL.

Therefore, the pixel driving circuit layer PDL may include at least two metal layers and at least two insulation layers for insulating the at least two metal layers.

For example, the pixel driving circuit layer PDL may include a semiconductor layer 11, a gate insulation layer 103 which covers the semiconductor layer 11, a gate electrode 13 which is formed on the gate insulation layer 103, a first terminal 14 (e.g., anode electrode), a second terminal 15 (e.g., a cathode electrode), and a middle insulation layer 104 which covers the gate electrode 13 and the gate insulation layer 103.

The driving transistor Tdr, the switching transistor Tsw1, the storage capacitor Cst, and the sensing transistor Tsw2 may be formed by the semiconductor layer 11, a gate insulation layer 103 which covers the semiconductor layer 11, the gate electrode 13, the first terminal 14, the second terminal 15, and the middle insulation layer 104.

The gate line GL may be provided on the gate insulation layer 103 or the middle insulation layer 104.

The pixel driving circuit layer PDL may further include a buffer 102 which is provided between the driving transistor Tdr and the substrate 101.

That is, as illustrated in FIG. 5, a blocking layer LS overlapping a semiconductor layer of the driving transistor Tdr may be provided on the substrate 101, and the blocking layer LS may be covered by the buffer 102.

Each of the buffer 102, the gate insulation layer 103, and the middle insulation layer 104 may be formed of at least one inorganic layer or at least one organic layer, or may be formed of at least one inorganic layer and at least one organic layer.

Each of the gate electrode 13, the first terminal 14, the second terminal 15, the gate line GL, the data line DL, various signal lines, and the blocking layer LS may include at least one of various metals such as a copper (Cu)-molybdenum (Mo) alloy (MoTi).

The planarization layer 105 may be provided on the pixel driving circuit layer PDL.

For example, the pixel driving circuit layer PDL may include various kinds of transistors and signal lines configuring the pixel driving circuit PDC. In this case, heights of the various kinds of transistors and signal lines may differ, and a height of a region where the transistors and the signal lines are provided may differ from that of a region where a transistor or a signal line is not provided.

Due to such a height difference, an upper surface formed by the transistors and the signal lines may not be flat. Accordingly, an upper surface of the pixel driving circuit layer PDL may not be flat.

The planarization layer 105 may perform a function of planarizing the upper surface of the pixel driving circuit layer PDL. That is, the planarization layer 105 may be formed by a thickness which is greater than that of the pixel driving circuit layer PDL, and thus, an upper surface of the planarization layer 105 may configure a flat surface.

The planarization layer 105 may be formed of at least one organic layer or at least one inorganic layer, or may be formed of at least one inorganic layer and at least one organic layer.

Particularly, in the present disclosure, the planarization layer 105 may include a black material, for absorbing light flowing in from the outside.

The black material may be, for example, poly-acryl which includes a black pigment (a light-absorbing material) at a certain ratio, or may be poly-acryl where a red pigment (a light-absorbing material) and a blue pigment (a light-absorbing material) are mixed at a certain ratio.

That is, the planarization layer 105 which has a black color based on a black material may absorb light flowing in from the outside, and thus, a reflectance of a light emitting display panel may be reduced. When a reflectance of the light emitting display panel is reduced, reflected light seen with eyes of a user may decrease, and thus, the user may see the light emitting display panel without dazzling caused by the reflected light.

The anode electrodes AE may be provided on the planarization layer 105. The anode electrode AE may configure a light emitting device ED.

The anode electrode AE, as illustrated in FIGS. 2 and 5, may be electrically connected to the driving transistor Tdr included in the pixel driving circuit layer PDL and may be patterned for each pixel 110.

The anode electrode AE may be one of two electrodes configuring the light emitting device ED. For example, when the light emitting device ED is an organic light emitting diode, the organic light emitting diode may include a first pixel electrode, a light emitting layer EL provided on the first pixel electrode, and a second pixel electrode provided on the light emitting layer EL. The first pixel electrode may be the anode electrode AE, and the second pixel electrode may be a cathode electrode CE. In this case, the anode electrode AE may be connected to the driving transistor Tdr.

That is, the anode electrode AE provided on the planarization layer 105 may be electrically connected to a transistor (particularly, the driving transistor Tdr) included in the pixel driving circuit layer PDL.

To this end, a contact hole may be provided in the planarization layer 105, and a connection electrode provided in the contact hole may be connected to the anode electrode AE. The connection electrode may be connected to the driving transistor Tdr.

The anode electrode AE may include a transparent electrode such as indium tin oxide (ITO) or indium zinc oxide (IZO), or may include an opaque electrode such as copper (Cu), or may include a transparent electrode and an opaque electrode.

The anode electrodes AE may include a white anode electrode WAE included in a white pixel W, a green anode electrode GAE included in a green pixel G, a blue anode electrode BAE included in a blue pixel B, and a red anode electrode RAE included in a red pixel R.

A white quantum layer WQDL (e.g., a first quantum dot layer) may be provided under the white anode electrode WAE, and a blue quantum layer BQDL (e.g., a second quantum dot layer) may be provided under the blue anode electrode BAE.

To this end, a first groove 109a may be provided in a region of the planarization layer 105, where the white anode electrode WAE is provided, and the white quantum layer WQDL may be provided in the first groove 109a.

Moreover, a second groove 109b may be provided in a region of the planarization layer 105, where the blue anode electrode BAE is provided, and the blue quantum layer BQDL may be provided in the second groove 109b.

For example, in a process of manufacturing the light emitting display panel, the planarization layer 105 may be provided on the middle insulation layer 104, and then, the first groove 109a and the second groove 109b may be formed in the planarization layer 105 through an exposure process and an etching process which use a mask.

After the first groove 109a and the second groove 109b are formed, an organic solvent including a blue quantum dot may be distributed to the first groove 109a and the second groove 109b by using an inkjet process, and thus, the white quantum layer WQDL and the blue quantum layer BQDL may be formed. However, the white quantum layer WQDL and the blue quantum layer BQDL may be formed by other processes (for example, a process of depositing an organic material or an inorganic material including a blue quantum dot) instead of the inkjet process.

Depths X of the first groove 109a and the second groove 109b, as illustrated in FIG. 5, may be the same.

In this case, a height of the white quantum layer WQDL may be formed to be greater than the depth X of the first groove 109a, and a height of the blue quantum layer BQDL may be formed to be greater than the depth X of the second groove 109b. In one embodiment, the depth X is less than a thickness of the planarization layer 105.

That is, in distributing an organic solvent including a blue quantum dot to the first groove 109a and the second groove 109b by using an inkjet process, when the organic solvent is distributed more than a volume of each of the first groove 109a and the second groove 109b, as illustrated in FIG. 5, a height of the white quantum layer WQDL may be formed to be greater than the depth X of the first groove 109a, and a height of the blue quantum layer BQDL may be formed to be greater than the depth X of the second groove 109b.

Therefore, the white anode electrode WAE and the blue anode electrode BAE may be provided on a plane which differs from the green anode electrode GAE and the red anode electrode RAE.

In this case, an upper surface of the white quantum layer WQDL and an upper surface of the blue quantum layer BQDL may be provided on the same plane, or may be provided on different planes.

As described above, a color temperature of white light and the luminance of blue light may be controlled by a height, a volume, or an area of each of the white quantum layer WQDL and the blue quantum layer BQDL including a blue quantum dot or the amount or density of a blue quantum dot.

Therefore, based on a characteristic of a light emitting display panel which is to be manufactured, the upper surface of the white quantum layer WQDL and the upper surface of the blue quantum layer BQDL may be provided on the same plane, or may be provided on different planes.

A bank 108 may be provided in the planarization layer 105 and may include opening portions at which the anode electrodes AE are exposed.

That is, the bank 108 may cover outer portions of the anode electrodes AE to form an opening portion through which light is emitted from one pixel 110. That is, a region, which is not covered by the bank 108, of the anode electrodes AE illustrated in FIG. 5 may be an opening portion.

To provide an additional description, the bank 108 may cover the outer portions of the anode electrode AE and may be provided in a display area 120 of the substrate 101 to expose the anode electrode AE.

The bank 108 may prevent or at least reduce a phenomenon where lights overlap between adjacent pixels.

The bank 108 may be formed of at least one inorganic layer or at least one organic layer, or may be formed of at least one inorganic layer and at least one organic layer.

Subsequently, the light emitting layer EL may be provided on a whole surface of the substrate 101 to cover the anode electrodes AE and the bank 108.

The light emitting layer EL may include one of an organic light emitting layer, an inorganic light emitting layer, and a quantum dot light emitting layer, or may include a stack or combination structure of an organic light emitting layer (or an inorganic light emitting layer) and a quantum dot light emitting layer.

The light emitting layer EL may include a hole injection layer (HIL), a hole transport layer (HTL), a hole blocking layer (HBL), an electron injection layer (EIL), an electron transport layer (ETL), an electron blocking layer (EBL), and a charge generating layer (CGL).

In a case where the light emitting layer EL emits white light, the light emitting layer EL may include hole injection layer (HIL)/hole transport layer (HTL), a blue organic layer, electron injection layer (EIL)/charge generating layer (CGL)/electron transport layer (ETL), a red organic layer, a yellow-green organic layer, electron injection layer (EIL)/charge generating layer (CGL)/electron transport layer (ETL), a blue organic layer, electron injection layer (EIL)/electron transport layer (ETL), and an organic buffer, which are sequentially stacked on the anode electrode AE.

The light emitting layer EL may include layers having various stack orders, in addition to layers having a stack order described above.

The light emitting layer EL applied to the present disclosure may emit white light, and thus, color filters CF may be provided on the light emitting layer EL (particularly, on an encapsulation layer 106).

Subsequently, the cathode electrode CE may be provided on the light emitting layer EL, and particularly, may be provided in a plate shape in the display area 120 and a non-display area 130.

The cathode electrode CE may be a second pixel electrode of an organic light emitting diode.

In a case where the light emitting display panel 100 according to the present disclosure uses a top emission type, the cathode electrode CE may be formed of a transparent electrode, and for example, may include ITO or IZO.

Subsequently, the cathode electrode CE may be covered by the encapsulation layer 106.

The encapsulation layer 106 may be formed of at least one organic layer or at least one inorganic layer, or may be formed of at least one inorganic layer and at least one organic layer.

Water and oxygen flowing in from the outside may be blocked by the encapsulation layer 106 and may not penetrate into the light emitting layer EL.

Subsequently, the color filters CF may be provided on the encapsulation layer 106.

The color filters CF may be formed at positions corresponding to opening portions of the green pixel G, the blue pixel B, and the red pixel R.

A green color filter CF_G may be provided on the green anode electrode GAE, a blue color filter CF_B may be provided on the blue anode electrode BAE, and a red color filter CF_R may be provided on the red anode electrode RAE.

Finally, the encapsulation layer 106 and the color filters CF may be covered by a passivation layer 107.

The passivation layer 107 may be formed of at least one organic layer or at least one inorganic layer, or may be formed of at least one inorganic layer and at least one organic layer.

Moreover, the passivation layer 107 may be a barrier substrate, and the barrier substrate may be attached on upper surfaces of the encapsulation layer 106 and the color filters CF by using an adhesive.

In this case, the barrier substrate may be a glass substrate, or may be a film.

Figure 6:
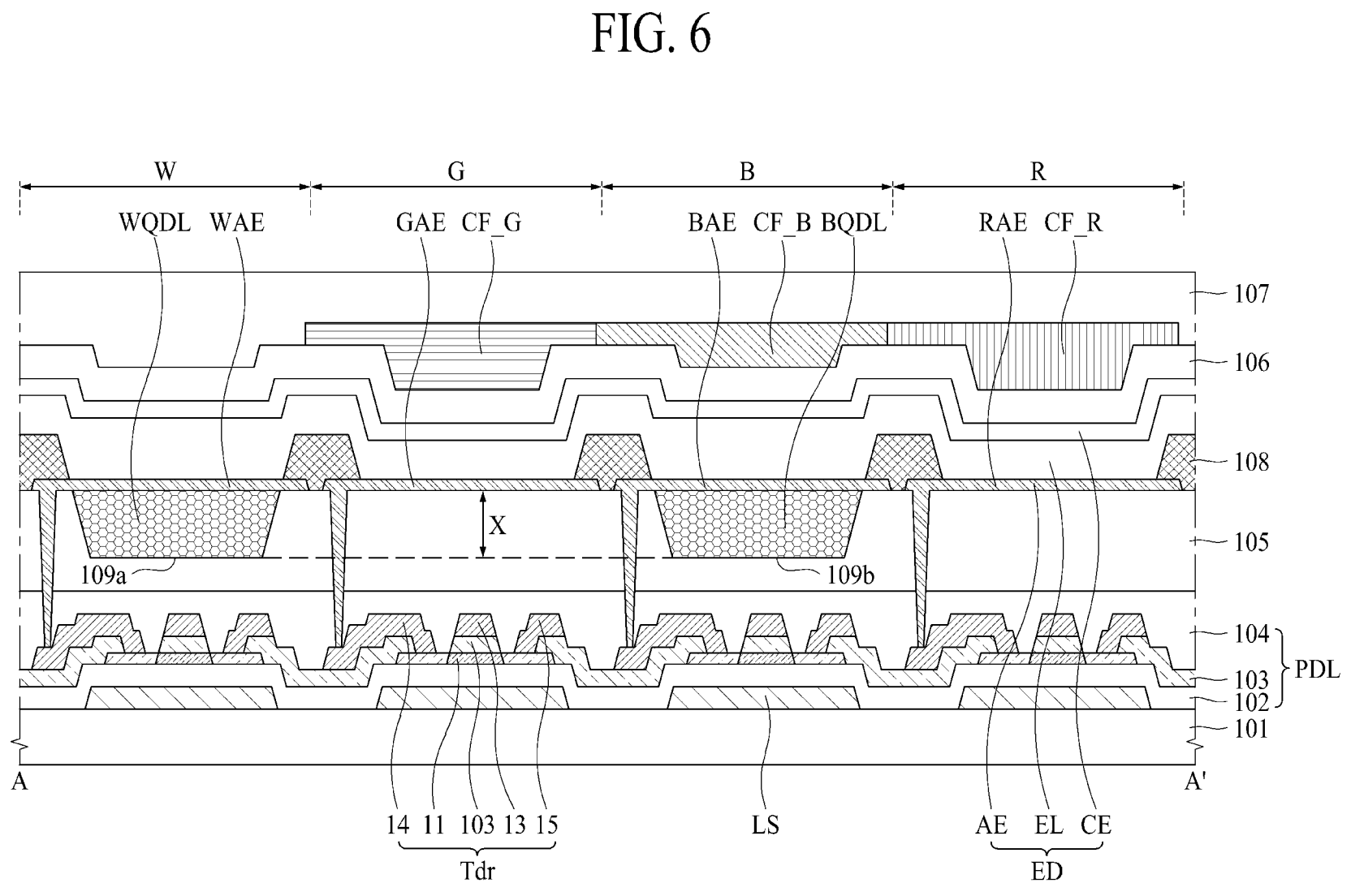
Figure 7:
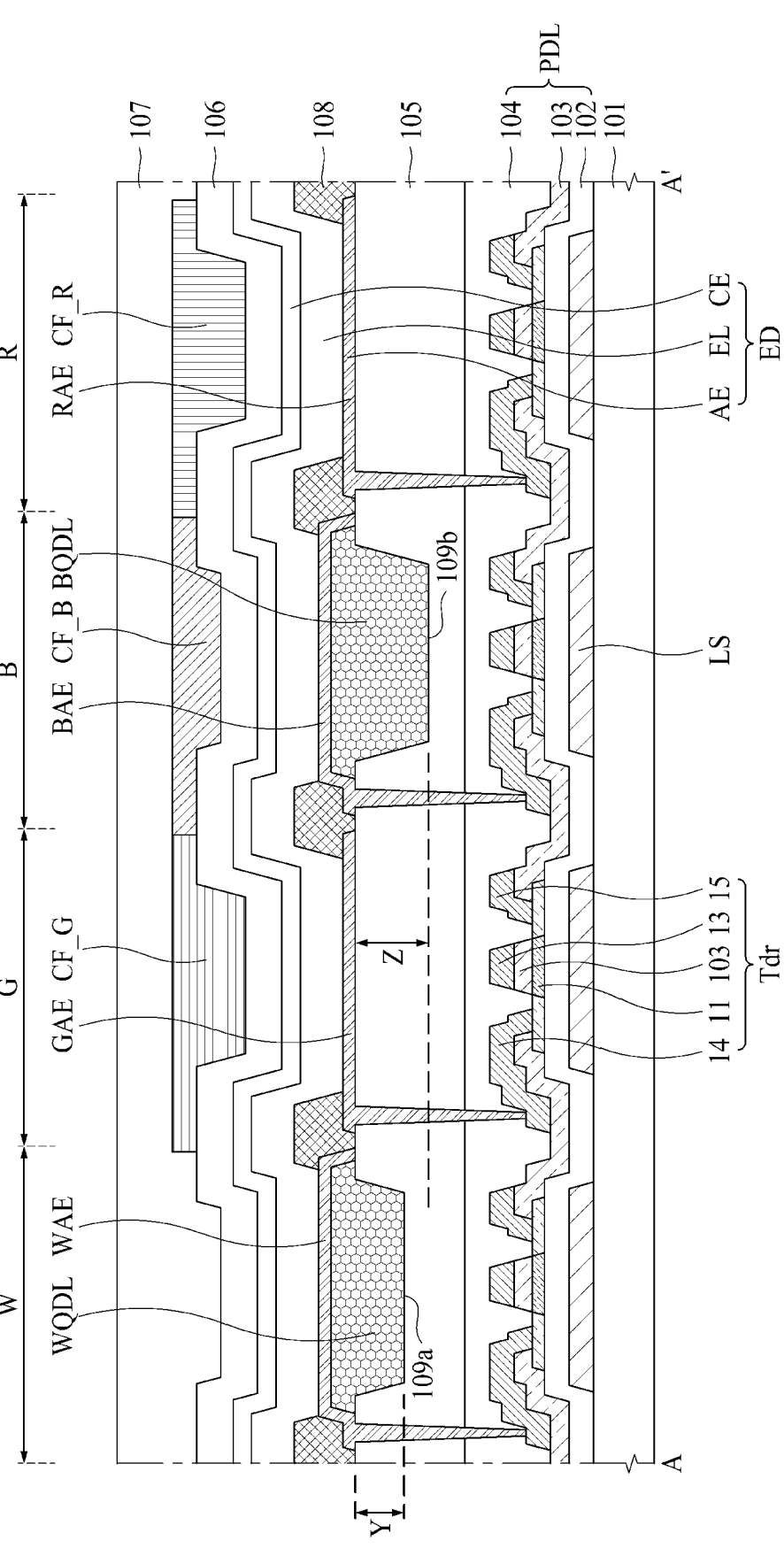
Figure 8:
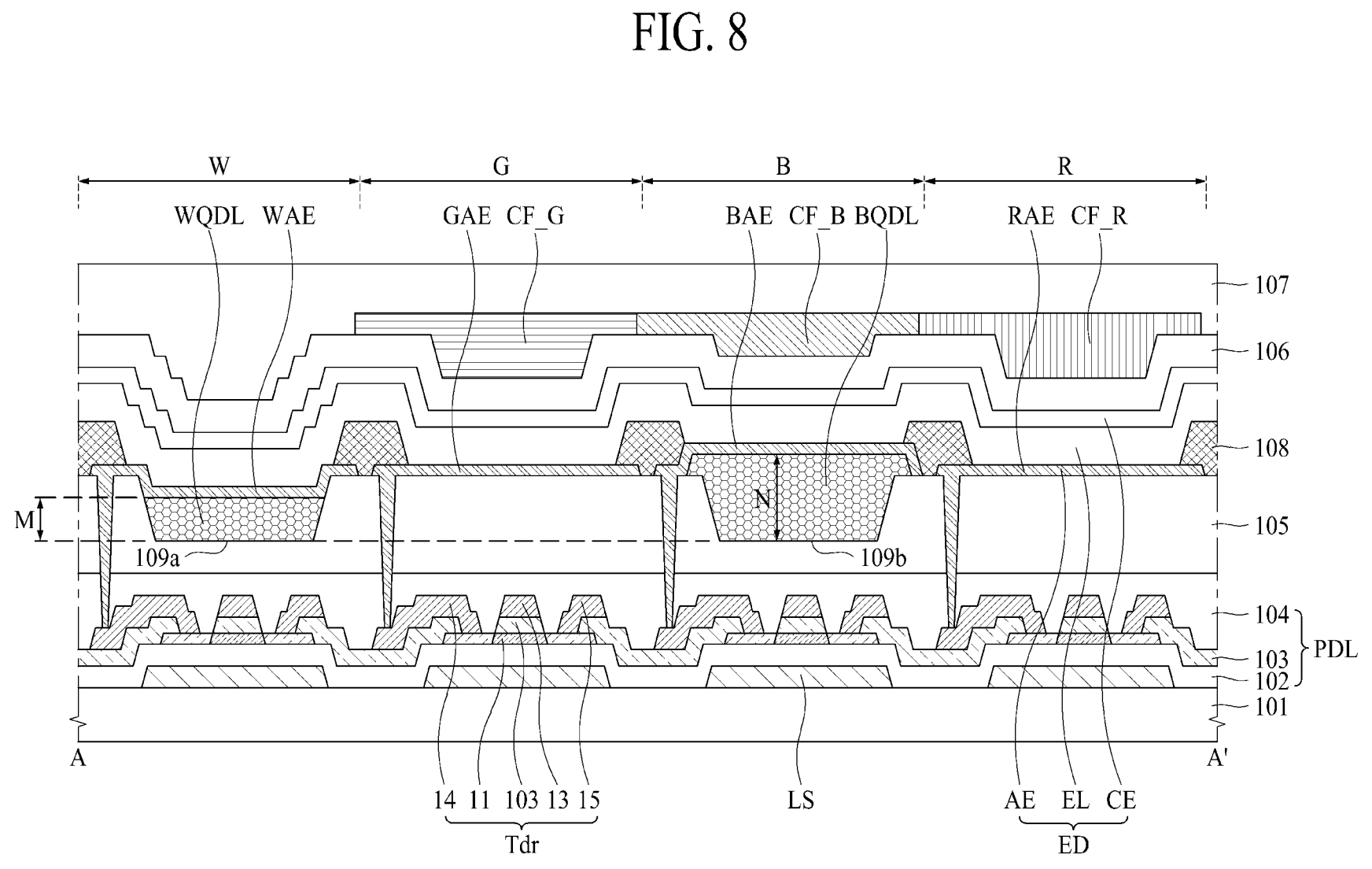

FIGS. 6 to 8 are other exemplary diagrams illustrating in detail a cross-sectional surface taken along line A-A' illustrated in FIGS. 3A and 3B according to other embodiments. In the following description, descriptions which are the same as or similar to descriptions given above with reference to FIGS. 1 to 5 are omitted or will be briefly given.

The light emitting display panel according to the present disclosure, as described above, may include a pixel driving circuit layer PDL which is provided on a substrate 101, a planarization layer 105 which covers the pixel driving circuit layer PDL, anode electrodes AE which are provided on the planarization layer 105, a white quantum layer WQDL which is provided under a white anode electrode WAE of the anode electrodes AE and includes quantum dots, and a blue quantum layer BQDL which is provided under a blue anode electrode BAE of the anode electrodes AE and includes quantum dots.

That is, a white quantum layer WQDL may be provided under the white anode electrode WAE, and a blue quantum layer BQDL may be provided under the blue anode electrode BAE.

To this end, a first groove 109a may be provided in a region of the planarization layer 105 where the white anode electrode WAE is provided, and the white quantum layer WQDL may be provided in the first groove 109a.

Moreover, a second groove 109b may be provided in a region of the planarization layer 105 where the blue anode electrode BAE is provided, and the blue quantum layer BQDL may be provided in the second groove 109b.

First, as illustrated in FIGS. 5 and 6, a depth X of the first groove 109a may be the same as a depth X of the second groove 109b.

In this case, in the light emitting display panel illustrated in FIG. 5, a height of the white quantum layer WQDL may be formed to be greater than the depth X of the first groove 109a, and a height of the blue quantum layer BQDL may be formed to be greater than the depth X of the second groove 109b.

On the other hand, in the light emitting display panel according to the present disclosure, as illustrated in FIG. 6, a height of the white quantum layer WQDL may be equal to the depth X of the first groove 109a, and a height of the blue quantum layer BQDL may be equal to the depth X of the second groove 109b.

For example, in a case where an inkjet process is used, by controlling the amount of organic solvent, a height of the white quantum layer WQDL may be equal to the depth X of the first groove 109a, and a height of the blue quantum layer BQDL may be equal to the depth X of the second groove 109b.

Moreover, in a case where a process of depositing an organic material or an inorganic material including a blue quantum dot is used, a height of the white quantum layer WQDL and a height of the blue quantum layer BQDL may be equal to the depth X of the first groove 109a and the depth X of the second groove 109b through an exposure process and an etching process which use a mask.

For example, in a light emitting display panel having a feature where the emission efficiency of light increases when all anode electrodes AE are provided on the same plane, as illustrated in FIG. 6, a height of the white quantum layer WQDL and a height of the blue quantum layer BQDL may be equal to the depth X of the first groove 109a and the depth X of the second groove 109b.

That is, the white quantum layer WQDL and the blue quantum layer BQDL may be respectively provided in the first groove 109a and the second groove 109b.

As illustrated in FIG. 7, a depth Y of the first groove 109a may differ from a depth Z of the second groove 109b in one embodiment.

In this case, a height of the white quantum layer WQDL may be different from or equal to a height of the blue quantum layer BQDL.

Moreover, an upper surface of the white quantum layer WQDL and an upper surface of the blue quantum layer BQDL may be provided on the same plane, or may be provided on different planes.

Moreover, as illustrated in FIG. 7, a height of the white quantum layer WQDL may be greater than the depth Y of the first groove 109a, and a height of the blue quantum layer BQDL may be greater than the depth Z of the second groove 109b. As shown in FIG. 7, depth Y and depth Z are different from each other. In one embodiment, depth Z is greater than depth Y.

Moreover, as in the light emitting display panel described above with reference to FIG. 6, a height of the white quantum layer WQDL may be equal to the depth Y of the first groove 109a, and a height of the blue quantum layer BQDL may be equal to the depth Z of the second groove 109b.

That is, a color temperature of white light and the luminance of blue light may be controlled by a height, a volume, or an area of each of the white quantum layer WQDL and the blue quantum layer BQDL including a blue quantum dot or the amount or density of a blue quantum dot.

Therefore, when it is required to adjust heights or thicknesses of the white quantum layer WQDL and the blue quantum layer BQDL, depths of the first groove 109a and the second groove 109b may be variously changed.

Moreover, when it is required to adjust volumes of the white quantum layer WQDL and the blue quantum layer BQDL, depths or widths of the first groove 109a and the second groove 109b may be variously changed.

Finally, as illustrated in FIG. 8, a depth of the first groove 109a may be equal to a depth of the second groove 109b, and a height M of the white quantum layer WQDL may differ from a height of the blue quantum layer BQDL.

In this case, the blue anode electrode BAE may be provided in the second groove 109b and the white anode electrode WAE may be provided on an upper surface of the first groove 109a, or as illustrated in FIG. 8, the white anode electrode WAE may be provided in the first groove 109*a* and the blue anode electrode BAE may be provided on an upper surface of the second groove 109*b*.

That is, when it is required to adjust heights, thicknesses, or volumes of the white quantum layer WQDL and the blue quantum layer BQDL, depths of the first groove 109*a* and the second groove 109*b* may be equal, and heights or thicknesses of the white quantum layer WQDL and the blue quantum layer BQDL may differ. For example, the height M of the white quantum layer WQDL is less than the height N of the blue quantum layer BQDL.

According to various embodiments of the present disclosure described above, a color temperature of white light may be variously controlled, the quality of blue light may be variously controlled, and the luminance of white light and blue light may be variously controlled also.

Figure 9:
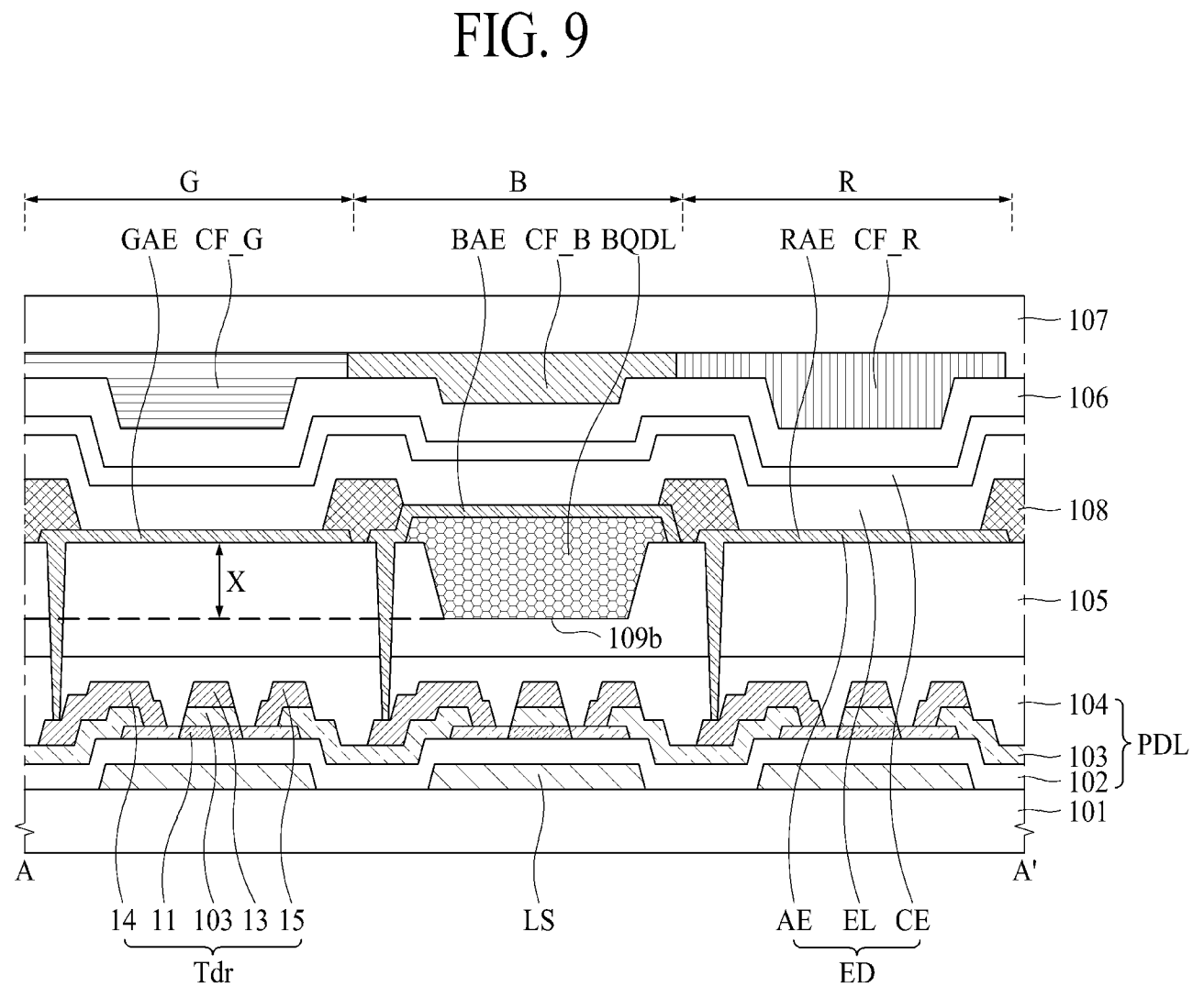

FIG. 9 is another exemplary diagram illustrating a cross-sectional surface of a light emitting display panel according to the present disclosure.

The light emitting display panel according to the present disclosure, as described above, may include a pixel driving circuit layer PDL which is provided on a substrate 101, a planarization layer 105 which covers the pixel driving circuit layer PDL, anode electrodes AE which are provided on the planarization layer 105, and a blue quantum layer BQDL which is provided under a blue anode electrode BAE of the anode electrodes and includes quantum dots.

Particularly, in the light emitting display panel according to the present disclosure described above with reference to FIGS. 3A to 8, a unit pixel may include a white pixel W, a green pixel G, a blue pixel B, and a red pixel R. However, the present disclosure is not limited thereto.

That is, in the light emitting display panel according to the present disclosure, as illustrated in FIG. 9, a unit pixel 140 may include a green pixel G, a blue pixel B, and a red pixel R. When the unit pixel 140 includes the green pixel G, the blue pixel B, and the red pixel R, the blue pixel B may be provided between the green pixel G and the red pixel R.

In this case, as illustrated in FIG. 9, a height of the blue quantum layer BQDL may be greater than a depth X of a second groove 109*b* as described above with reference to FIG. 5.

On the other hand, a height of the blue quantum layer BQDL may be equal to the depth X of the second groove 109*b* as described above with reference to FIG. 6.

Moreover, as described above with reference to FIG. 8, the blue anode electrode BAE may be provided in the second groove 109*b*, or may be provided on an upper surface of the second groove 109*b*.

That is, when a unit pixel includes a green pixel G, a blue pixel B, and a red pixel R, the blue pixel may be formed in one structure of various structures described above with reference to FIGS. 5 to 8. Also, descriptions given above with reference to FIGS. 1 to 8 may be identically applied to a light emitting display panel where a unit pixel includes a green pixel G, a blue pixel B, and a red pixel R.

According to the present disclosure, a planarization layer including a black material may be provided in a whole display area of a light emitting display panel. In this case, light flowing from the outside into an inner portion of the light emitting display panel may be absorbed by the planarization layer, and thus, a reflectance of the light emitting display panel may decrease.

According to the present disclosure, a quantum layer including blue quantum dots scattering blue light may be provided under an anode electrode configuring a white pixel and an anode electrode configuring a blue pixel. Accordingly, the luminance of the blue pixel may increase, and a color temperature of the white pixel may be enhanced.

According to the present disclosure, the white pixel including the quantum layer may be apart from the blue pixel including the quantum layer. Therefore, the blue pixel may be adjacent to a red pixel and a green pixel. In this case, light scattered by the quantum layer in the white pixel may be blue light on the basis of blue quantum dots. Therefore, blue light scattered by the quantum layer in the white pixel may not be output to the outside through the red pixel and the green pixel. Because blue light scattered by the quantum layer in the blue pixel is blue light, blue light scattered by the quantum layer in the blue pixel may not be output to the outside through the red pixel and the green pixel. Accordingly, according to the present disclosure, light leakage may not occur between pixels.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display panel comprising:
   a pixel driving circuit layer on a substrate;
   a planarization layer on the pixel driving circuit layer;
   a plurality of anode electrodes on the planarization layer, the plurality of anode electrodes including a white anode electrode and a blue anode electrode;
   a white quantum layer under the white anode electrode such that the white quantum layer is closer to the substrate than the white anode electrode, the white quantum layer including first quantum dots; and
   a blue quantum layer under the blue anode electrode such that the blue quantum layer is closer to the substrate than the blue anode electrode, the blue quantum layer including second quantum dots.

2. The light emitting display panel of claim 1, wherein the planarization layer comprises a black material that absorbs light.

3. The light emitting display panel of claim 1, wherein each of the first quantum dots and the second quantum dots comprise blue quantum dots that scatter blue light.

4. The light emitting display panel of claim 1, wherein a red pixel including a red anode electrode or a green pixel including a green anode electrode is between a white pixel including the white anode electrode and a blue pixel including the blue anode electrode.

5. The light emitting display panel of claim 1, wherein each of the white quantum layer and the blue quantum layer is on the planarization layer.

6. The light emitting display panel of claim 5, wherein the planarization layer includes a first groove that overlaps the white anode electrode and a second groove that overlaps the blue anode electrode, the white quantum layer in the first groove and the blue quantum layer in the second groove.

7. The light emitting display panel of claim 6, wherein a height of the white quantum layer is greater than a depth of the first groove, and a height of the blue quantum layer is greater than a depth of the second groove.

8. The light emitting display panel of claim 7, wherein an upper surface of the white quantum layer and an upper surface of the blue quantum layer are provided on a same plane.

9. The light emitting display panel of claim 6, wherein a depth of the first groove is equal to a depth of the second groove, a height of the white quantum layer is equal to the depth of the first groove, and a height of the blue quantum layer is equal to the depth of the second groove.

10. The light emitting display panel of claim 6, wherein a depth of the first groove is different from a depth of the second groove.

11. The light emitting display panel of claim 10, wherein a depth of the white quantum layer is different from a depth of the blue quantum layer.

12. The light emitting display panel of claim 10, wherein an upper surface of the white quantum layer and an upper surface of the blue quantum layer are on a same plane.

13. The light emitting display panel of claim 6, wherein a depth of the first groove is equal to a depth of the second groove, and a height of the white quantum layer is different from a height of the blue quantum layer.

14. The light emitting display panel of claim 13, wherein a portion of the white anode electrode is in the first groove, or a portion of the blue anode electrode is in the second groove.

15. A light emitting display panel comprising:
a pixel driving circuit layer on a substrate;
a planarization layer on the pixel driving circuit layer;
a plurality of anode electrodes on the planarization layer, the plurality of anode electrodes including a blue anode electrode; and
a blue quantum layer provided under the blue anode electrode such that the blue quantum layer is closer to the substrate than the blue anode electrode, the blue quantum layer including quantum dots,
wherein the blue pixel including the blue quantum layer and the blue anode electrode is provided between a red pixel that outputs red light and a green pixel that outputs green light, and wherein the planarization layer comprises a groove that overlaps the blue anode electrode, the blue quantum layer is in the groove, and the blue quantum layer is covered by the blue anode electrode.

16. The light emitting display panel of claim 15, wherein the quantum dots comprise blue quantum dots that scatter blue light.

17. The light emitting display panel of claim 15, wherein the blue quantum layer is on the planarization layer.

18. The light emitting display panel of claim 15, wherein a height of the blue quantum layer is greater than a depth of the groove, a height of the blue quantum layer is equal to a depth of the groove, or the blue anode electrode is in the groove.

19. A light emitting display panel comprising:
a pixel driving circuit layer on a substrate;
a planarization layer on the pixel driving circuit layer, the planarization layer including black material that absorbs light;
a plurality of anode electrodes on the planarization layer;
a quantum layer under an anode electrode from the plurality of anode electrodes such that the quantum layer is closer to the substrate than the anode electrode, the quantum layer including quantum dots; and
another quantum layer under another anode electrode from the plurality of anode electrodes such that the other quantum layer is closer to the substrate than the other anode electrode, the other quantum layer including quantum dots,
wherein the anode electrode is included in a blue subpixel and the quantum dots include blue quantum dots that scatter blue light, and
wherein the other anode electrode is included in a white subpixel and the quantum dots included in the other quantum layer include the blue quantum dots that scatter blue light.

20. The light emitting display panel of claim 19, wherein either a red subpixel or a green subpixel is between the white subpixel and the blue subpixel.

21. The light emitting display panel of claim 19, wherein the planarization layer includes a first groove that overlaps the anode electrode and a second groove that overlaps the other anode electrode, the quantum layer in the first groove and the other quantum layer is in the second groove.

* * * * *